United States Patent [19]
Yiannoulos

[11] Patent Number: 5,942,775
[45] Date of Patent: Aug. 24, 1999

[54] PHOTOSENSING DEVICE WITH IMPROVED SPECTRAL RESPONSE AND LOW THERMAL LEAKAGE

[75] Inventor: Aris Antony Yiannoulos, Wyomissing Hills, Pa.

[73] Assignee: Lucent Technologies Inc., Murray Hill, N.J.

[21] Appl. No.: 08/846,769

[22] Filed: Apr. 30, 1997

[51] Int. Cl.$^6$ .............................. H01L 31/06; H01L 31/00
[52] U.S. Cl. ..................... 257/292; 257/291; 257/448; 257/461; 257/464
[58] Field of Search .................................. 257/290, 291, 257/292, 444, 448, 461, 463, 464

[56] References Cited

U.S. PATENT DOCUMENTS

| | | | |
|---|---|---|---|
| 4,155,094 | 5/1979 | Ohba | 257/292 |
| 4,238,760 | 12/1980 | Carr | 257/292 |
| 4,951,105 | 8/1990 | Yamada | 257/444 |
| 5,608,243 | 3/1997 | Chi | 257/292 |
| 5,625,210 | 4/1997 | Lee | 257/292 |

Primary Examiner—Jerome Jackson, Jr.

[57] ABSTRACT

A photosensing device is provided which has a photojunction structure that includes a junction of a photodiode and a body-junction of a photo-capacitor operating in an inversion mode. The photojunction structure is fabricated with standard complementary MOS (CMOS) technology features and includes an edge that is guarded against known leakage-causing hazards. In one embodiment, the photodiode junction is surrounded by the body-junction of a poly-gate MOS capacitor to form the photojunction. The photojunction can be placed deeply under a surface of the photosensing device by utilizing a deep diode diffusion to exhibit a better response at the red end of the spectrum. In another embodiment, both shallow and deep junction diodes are combined so that the photojunction has a composite depth which can be used to weight the spectral response to favor one or the other end of the light spectrum. In another embodiment, a portion of a body-junction of a MOS field effect transistor (MOSFET) is incorporated as part of the edge of the photojunction. This particular embodiment extends protection against known leakage hazards to include a switch device which is normally needed to connect the photosensing device to its operating environment.

29 Claims, 4 Drawing Sheets

PHOTOSENSING DEVICE WITH IMPROVED SPECTRAL RESPONSE AND LOW THERMAL LEAKAGE

CROSS REFERENCES TO RELATED APPLICATIONS

This application is related to another U.S. patent application Ser. No. 08/846,967 entitled "INTEGRATED PHOTOSENSING DEVICE FOR ACTIVE PIXEL SENSOR IMAGERS" (YIANNOULOS-8), having a filing date of Apr. 29, 1997, having a common inventor and assignee and being incorporated herein by reference.

FIELD OF THE INVENTION

This invention relates to the field of semiconductor photosensing devices, and more particularly, to photosensing devices for Active Pixel Sensor (APS) imaging arrays.

BACKGROUND OF THE INVENTION

Established markets for solid-state image sensor technology include computer multimedia devices, video phones, toys, cameras, surveillance equipment, automotive, personal imaging equipment, x-ray imaging, manufacturing inspection, and telemedicine. In the camera market, in particular, solid-state image sensors which convert light into electric signals have been utilized to produce video cameras which are more lightweight, require less power, and are less expensive and more sensitive to light than traditional camera designs. Initial development strides in solid-state image sensor technology were directed toward silicon charge-coupled devices (CCD). A more recent trend in solid-state image sensor technology is the development of active pixel sensor (APS) technology.

APS technology has several important advantages over CCD technology. For example, the cost of fabricating an APS wafer is typically much less than the cost of fabricating a similar wafer using a specialized CCD process. Additionally, the APS wafer is produced with the same commercially available Complementary Metal-Oxide-Semiconductor (CMOS) device fabrication process used in nearly all modem microprocessors, memory, and logic chips. However, an essential aspect to the development of new, higher performance, ultra-low power APS image and hybrid sensor readout applications is improved spectral response and low thermal leakage in CMOS-based photosensor devices.

Presently, the photosensor device in Active Pixel Sensor (APS) imagers is either a photodiode or a Metal Oxide Semiconductor (MOS) capacitor (also known as a photocapacitor). As compared with photo-capacitors, photodiodes are attractive because they are more sensitive to the blue end of the light spectrum and because they are less susceptible to the kind of oxide variations that cause threshold related fixed pattern noise. However, photodiodes tend to have greater thermal leakage than photo-capacitors and are more susceptible to the types of failures that cause white point defects. Since the causes of both leakage and point defects in diodes are related to junction depth and feature size, it is expected that photodiodes will eventually become too leaky for use in imager technology applications, especially as imager technology attempts to take advantage of a trend in CMOS technology toward finer line widths.

Accordingly, there is a need to provide a photosensor device with improved spectral response and lower thermal leakage than those devices found in the prior art.

SUMMARY OF THE INVENTION

In accordance with the present invention, a photosensing device is provided with a photojunction structure that can be fabricated with standard Complementary Metal-Oxide-Semiconductor (CMOS) technology features and, therefore, is fully compatible with Very Large Scale Integration (VLSI) semiconductor technology. In all embodiments of the present invention, a photojunction region is provided with an edge that is guarded against known leakage-causing hazards.

Generally, a photosensing semiconductor device according to the present invention includes a semiconductor substrate, a junction diode integrated on the semiconductor substrate, and a Metal Oxide Semiconductor (MOS) capacitor integrated on the semiconductor substrate and surrounding the junction diode physically and electrically. The photojunction region of the photosensing device is defined by a junction region of the junction diode and a body-junction region of the MOS capacitor when biased into an inversion mode. The photojunction region operates as a sensing region for the photosensing device. The MOS capacitor can be a poly-gate MOS capacitor, also referred to as a photocapacitor. In one variation, the photojunction can be placed deeply under a surface of the photosensing device by utilizing a deep diode diffusion. In this variation, the photojunction exhibits a better response at the red end of the spectrum.

In one exemplary embodiment, both shallow and deep junction diodes are combined so that the photojunction region has a composite depth. This particular embodiment permits weighting of the spectral response accordingly to favor one of the ends of the spectrum (e.g., red or blue end).

In yet another exemplary embodiment, a portion of a body-junction region of a MOS field-effect transistor (MOSFET) is incorporated as part of the edge of the photojunction region. This particular embodiment extends protection against known leakage hazards to include a switch device which is normally needed to connect the photosensing device to its operating environment.

Accordingly, these and other embodiments of the present invention provide a low leakage photosensing device with selectable spectral response.

BRIEF DESCRIPTION OF THE DRAWINGS

A more complete understanding of the present invention may be obtained from consideration of the following detailed description of the invention in conjunction with the drawings, with like elements referred to with like references, in which.

DETAILED DESCRIPTION OF THE INVENTION

Figure 1:
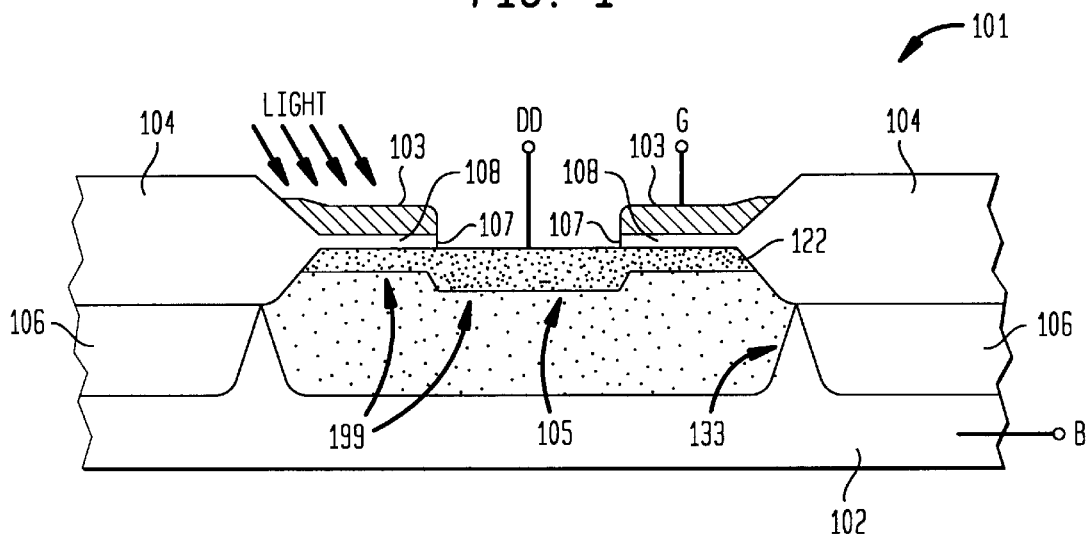
FIG. 1 is a cross section of a photosensing device in accordance with the present invention.

Although the present invention is particularly well suited for use in active pixel sensor (APS) technology, and shall be described with respect to this application, it would be understood that the apparatus disclosed can be applied to other photosensing device applications.

As will be described below in more detail, a photosensing device according to the principles of the invention delivers the combined advantages of both a photodiode and photocapacitor, while simultaneously overcoming certain disadvantages of each. In general, the photosensing device is a hybrid structure comprising a first part photodiode and a second part poly-gate Metal-Oxide-Semiconductor (MOS) capacitor (i.e., a photo-capacitor). More specifically, the photodiode is integrated on a semiconductor substrate and is surrounded by the photo-capacitor both physically and electrically. The photojunction region of the photosensing device is defined by a junction region of the photodiode and a body-junction region of the photocapacitor when biased into an inversion mode. The photojunction region operates as a sensing region for the photosensing device.

Generally, a photodiode in the present context is a p-n junction diode having a first electrical side comprising a region of the semiconductor substrate and a second electrical side comprising a shallow diffused feature of a different conductivity type than that of the semiconductor substrate. The second electrical side is disposed on a surface of the region of the semiconductor substrate. More specifically, the p-n junction diode is formed by diffusing an n-type feature into a p-type substrate, or by diffusing a p-type feature into an n-type substrate. The substrate region under the photodiode may be a virgin area of semiconductor substrate or a same-type tub diffused area. A same-type tub diffused area substrate would be an area of p-type substrate in which a light concentration of p-type tub has been diffused, or symmetrically, an area of n-type substrate into which a light concentration of n-type tub has been diffused. The p-type and n-type tubs are commonly used in CMOS technology for controlling the conductivity of the substrate and for other reasons that are well understood and appreciated by those familiar in the art.

A photo-capacitor in the present context is a poly-gate MOS capacitor structure having a first electrical side comprising a region of the semiconductor substrate, a spacer dielectric layer comprising a thin oxide feature (e.g., layer) disposed directly over the region of semiconductor substrate, and a second electrical side comprised of a conductive thin film disposed directly over the spacer dielectric layer. In the photo-capacitor, the spacer dielectric layer and the second electrical side are operably transparent to a target portion of the light spectrum. More specifically, the thin (gate) oxide feature is grown directly over an n-type tub area of the semiconductor substrate if the substrate is n-type, or p-type tub if the substrate is p-type. The conductive thin film is a polysilicon thin film field-plate disposed directly over the thin oxide feature. To simplify the description of the present invention hereinafter, all subsequent references to the substrate will be for the p-type substrate only. Those familiar with CMOS technology will understand that any discussion relating to p-type substrate applies symmetrically to n-type substrates and that all device types disclosed herein may be made using functionally equivalent complementary structures.

During operation generally, the photodiode and the photo-capacitor merge electrically, such that the photocurrents generated in the respective photosensing regions add constructively. For the photodiode and the photo-capacitor to become active (i.e., photosensing), a reverse bias is applied across the photodiode and an inverting bias is applied across the photo-capacitor. A particular requirement associated with merging a junction diode (e.g., photodiode) with an MOS capacitor (e.g., photo-capacitor) in the present invention is that the body-junction region of the MOS capacitor operating in the inversion mode and the junction region of the junction diode merge into a physically contiguous space charge region, and that the body-junction region of the MOS capacitor surrounds the junction region of the junction diode entirely. By way of example, the geometry that provides this merging may involve encircling features, both planar and three dimensional, and possibly parallel arraying.

It should be noted that the junction diode and the MOS capacitor can be integrated on the semiconductor substrate together with other semiconductor devices, which are interconnected with integrated circuits. In such a combination, the photosensing device according to the present invention is electrically isolated from the other semiconductor devices by an oxide ring disposed above diffused regions of the semiconductor substrate.

Referring now to FIG. 1, there is shown a cross-section of a photosensing device 101 constructed in accordance with the present invention and using a p-type silicon substrate 102. As previously noted, the photosensing device 101 is a hybrid structure combining a photodiode structure and a photo-capacitor structure. The photodiode structure is formed by diffusing an $n^+$ source/drain (S/D) feature 105 (referred hereinafter as $n^+$ diffusion layer feature 105) into a p-type tub (p-tub) substrate region 133. As shown, the p-tub substrate region 133 adjoins other n-tub or p-tub regions 106 of the substrate 102, and is also surrounded by a field (thick) oxide ($SiO_2$) layer 104. It should be noted that the other n-tub or p-tub regions 106 are not necessarily required for the present invention, but rather are material only with respect to overall CMOS technology in the context of a specific example of a layout.

As shown in FIG. 1, the photo-capacitor structure comprises a thin (gate) oxide layer feature 108 disposed over the p-tub substrate region 133. The photo-capacitor structure further includes a poly-gate, or other conductive thin film field-plate feature 103 disposed directly over the thin oxide feature 108. The photo-capacitor structure surrounds the photodiode structure and self-aligns with the photodiode structure in such a manner so that a periphery of the diffused $n^+$ diffusion layer feature 105 contacts an n-inversion layer feature 122 forming under the thin oxide feature 108 of the photo-capacitor when the device is operating. The n-inversion layer feature 122 forms during operation when bias applied across the photo-capacitor structure causes the region of the p-tub substrate region 133 under the thin oxide feature 108 to invert. By being in contact, the n-inversion layer feature 122 and the $n^+$ diffusion layer feature 105 behave electrically as a single n-type semiconductor region. Consequently, the photo-sensitive region of the photosensing device 101 is a photojunction 199 formed at the interface between the single n-type semiconductor region and the underlying p-tub substrate region 133.

The photosensing device 101 shown in FIG. 1 is a three terminal device comprising a body terminal B, a gate terminal G, and a diode terminal DD. More specifically, the photosensing device 101 requires separate electrical contacts to the substrate 102 through the body terminal B, to the thin film field-plate feature 103 of the photo-capacitor through the gate terminal G, and to the diffused side of the photodiode (i.e., n+ diffusion layer feature 105) through the diode terminal DD.

It should be noted that the essence of the present invention in protecting against known leakage hazards resides in where a periphery (i.e., an edge) of the photo-junction 199 is positioned on the surface of the semiconductor material relative to a periphery (i.e., an edge) 107 of the oxide cut (i.e., an edge of thin oxide feature 108). Furthermore, the essence of the present invention in providing enhanced spectral response at a particular portion of the spectrum resides in the depth at which photojunction 199 is positioned relative to the surface of the semiconductor material. For photosensing device 101, for example, the function of the n-inversion layer feature 122 is to extend the n-type feature of the photodiode laterally such that the edge of the photojunction 199 is positioned at an area of the semiconductor surface not compromised by the oxide cut. The depth of the n+ diffusion layer feature 105 is an adjustment parameter for the purpose of positioning the photojunction 199 at an advantageous distance from the surface of the semiconductor substrate. Referring again to FIG. 1, if the cross-section shown is taken to be a circular cross section, then extending the photojunction 199 to a three dimensional (3-D) configuration provides a photojunction which includes a junction formed between the n+ diffusion layer feature 105 and the underlying substrate region in p-tub substrate region 133, and a junction formed between the n-inversion layer feature 122 and its underlying substrate region in p-tub substrate region 133. Accordingly, the depth of the photojunction 199 assumes two effective values defined respectively by the depth of the n+ diffusion layer feature 105 and by the depth of the n-inversion layer feature 122.

As would be understood by a person skilled in the art, excessive photodiode leakage is caused by material defects aggregating at the periphery of a diffused photodiode which typically aligns with the periphery of an oxide cut. In a standard CMOS fabrication process, the oxide cut is defined as the mask window trough in which the diffusion is made. Excessive photodiode leakage associated with the photodiode's periphery is attributed to several factors, including: excess material defects that may precipitate at the periphery during fabrication; the curvature of the diffusion which attains its maximum at the periphery thus causing electric fields to concentrate; and surface lattice stresses, which are highest near the edge of the oxide cut and which cause the semiconductor bandgap to narrow. As is well known, high defect density regions crossing into junction space-charge regions (particularly high field density space-charge regions and narrowed bandgap regions) cause excessive photodiode leakage. In photosensing device 101, the n-inversion layer feature 122 effectively moves the edge of the photojunction 199 past the edge of the n+ diffusion layer feature 105 and past the edge of the oxide cut (i.e., the edge of thin oxide feature 108). Consequently, the peak fields associated with the junction edge are both reduced and moved away from the defect-prone and stress-prone areas that coincide with the edges of the n+ diffusion layer feature 105 and of the oxide cut (i.e., the edge of thin oxide feature 108).

The spectral sensitivity of the photosensing device 101 can be arbitrarily manipulated by adjusting the relative areas of the photo-capacitor and photodiode. In general, the spectral response of the photo-capacitor is poor at the blue end of the spectrum of incident light because most of the incident blue light is absorbed by the thin oxide feature 108 and field-plate feature 103 of the photo-capacitor superstructure. Since the top of the photodiode allows substantially more blue light through, the relative area of the photodiode can be increased to increase the relative sensitivity to blue light. Moreover, the spectral response of photosensing device 101 can be poor at the red end of the spectrum because all segments of the photojunction 199 are positioned at a relatively small distance from the surface of the semiconductor. In particular, red light can penetrate deep into the semiconductor without suffering significant absorption. If the design of photosensing device 101 places the photojunction 199 very close to the semiconductor surface, most red light may pass through the photojunction 199 rather than being absorbed there, thus making the sensor relatively insensitive to the red end of the spectrum. In CMOS technology, this design problem can be dealt with by using an n-tub diffusion to make deeper n-type diodes than those made with an n+ source/drain diffusion. To this end, the structure of other exemplary embodiments, shown in FIGS. 2 and 3 and discussed below in more detail, use an n-type rather than a p-type tub under the n+ diffusion layer feature 105.

Figure 2:
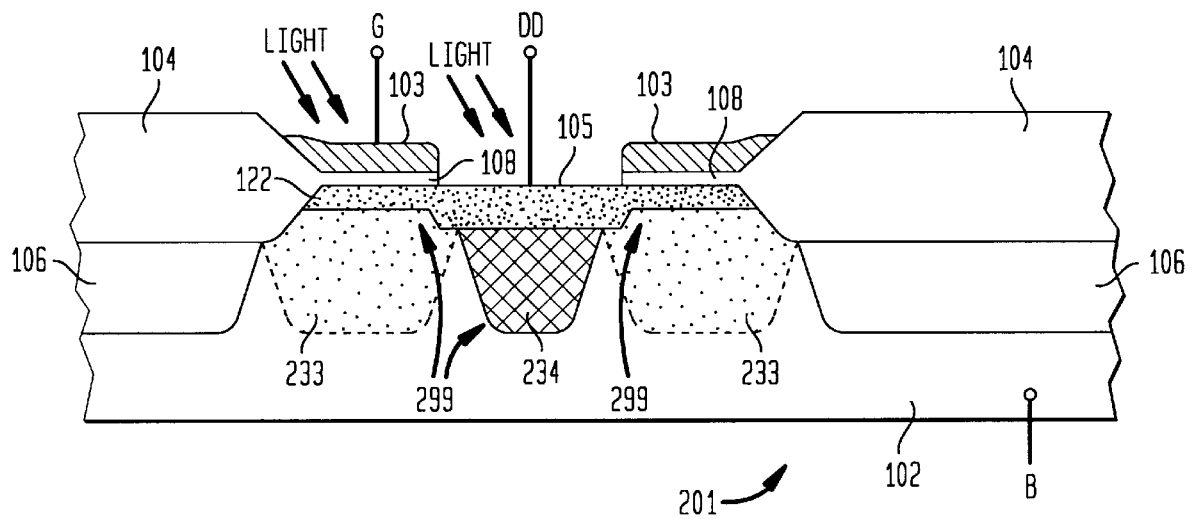
FIG. 2 is a cross section of the photosensing device of FIG. 1, modified to adjust for spectral sensitivity towards the red spectrum.

Referring now to FIG. 2, wherein elements previously referred to in FIG. 1 are referred to with the same reference numerals, there is shown a photosensing device 201 which produces improved sensitivity toward the red end of the spectrum as compared with the photosensing device 101 (FIG. 1). More specifically, photosensing device 201 includes an n-tub diffusion feature 234 disposed under n+ diffusion layer feature 105. The p-tub substrate region 233 is a ring geometry surrounding the n-tub diffusion feature 234 and underlying the photo-capacitor structure to provide similar functionality as p-tub substrate region 133 in photosensing device 101 (FIG. 1).

Figure 3:
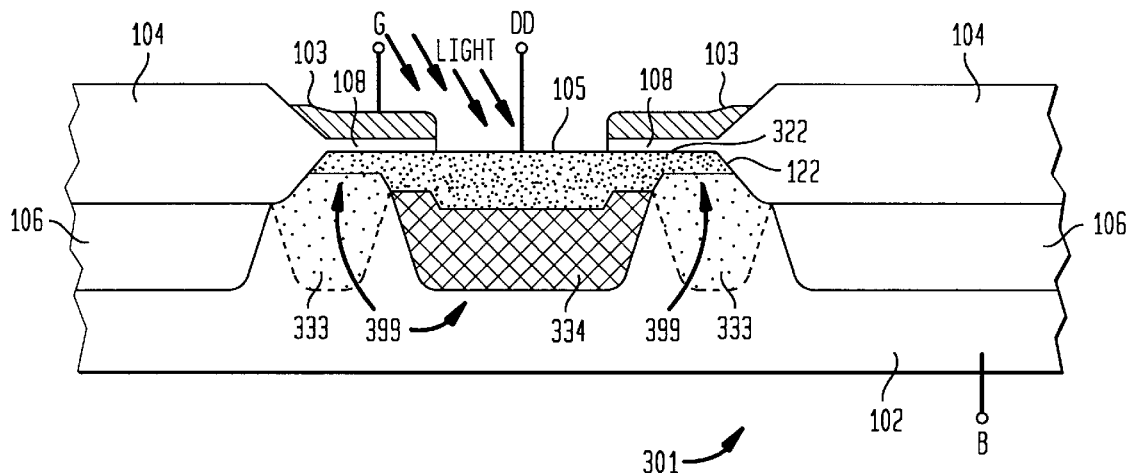
FIG. 3 is a cross section of the photosensing device of FIG. 2, modified for further spectral sensitivity towards the red spectrum.

As shown in another exemplary embodiment in FIG. 3, the relative sensitivity to the red end of the spectrum at the expense of the blue end can be increased using photosensing device 301. Specifically, the size of the n-tub diffusion feature 334 is increased at the expense of p-tub substrate region 333. By allowing the n-tub diffusion feature 334 to extend past the edge of the oxide cut and to partially underlie the photo-capacitor's thin oxide region (e.g., thin oxide feature 108), an accumulation layer 322 is formed between the n-inversion layer feature 122 and the n+ diffusion layer feature 105. Photojunction 399 forms between the n-tub diffusion feature 334 and the substrate 102, and continues between the n-inversion layer feature 122 and the p-tub substrate region 333. The effective depth of the photojunction 299 (FIG. 2) and 399 (FIG. 3) is controlled by the depth of the n-inversion layer feature 122, the depth of the n-tub diffusion feature 234 (FIG. 2) and 334 (FIG. 3), and the area of the photo-capacitor relative to the area of the photodiode. More specifically, for photosensing device 201, a ratio of the area of the photodiode to the total area of the photosensing device can be scaled to control the relative sensitivity at the red end of the light spectrum. Similarly, for photosensing device 301, a ratio of the area of the deep diffused feature (n-tub diffusion feature 334) to the total area of the photosensing device can be scaled to control the relative sensitivity at the red end of the light spectrum. By comparison, the effective depth of the photojunction 199 in FIG. 1 is controlled by the depth of the n-inversion layer feature 122, the depth of the n+ diffusion layer feature 105, and the area of the photo-capacitor relative to the area of the photodiode.

Now describing the operation of the photosensing devices 101/201/301 as shown in FIGS. 1, 2, and 3 respectively, the body terminal B (contacting substrate 102) is typically connected to external circuit ground. The photodiode structure is reverse biased by connecting the diode terminal DD of the photodiode structure to a positive bias potential $V_{DD}$. The photocapacitor structure is biased into inversion by connecting the gate terminal G to a bias potential $V_G$, where $V_G$ is a potential at least one threshold voltage ($V_{TH}$) greater than potential $V_{DD}$. $V_{TH}$ takes the value of the threshold voltage of the photo-capacitor, unless the photo-capacitor is a depletion-type device, in which case $V_{TH}$ may take a zero value. The photosensing device 101/201/301 is biased in the above manner for a continuous operating mode or for an active photo-integrating operating mode. The response of the photosensing device 101/201/301 in these two modes is a photo-current flowing out of the diode terminal DD (where the circuit completes through the body terminal B which serves as a reference terminal).

In a passive photo-integrating operating mode, which is the preferred mode for operating photosensing device 101/201/301 in imaging arrays, an operating cycle with three phases is utilized. Specifically, the operating cycle begins with a reset phase (i.e., a first phase) during which the photosensing device 101/201/301 is connected as described above for the continuous operating mode. The reset phase causes a charge Q to be stored across the photojunction 199/299/399 (FIGS. 1, 2, and 3 respectively). The reset phase is followed by an integration phase (i.e., a second phase) of duration $T_{IN}$. During the integration phase, the diode terminal DD and the gate terminal G are floated, i.e., they are disconnected from their respective biasing sources. Exposure to light during the integration phase causes the photojunction 199/299/399 to discharge at a rate proportional to light flux being absorbed within the photojunction 199/299/399 in such a manner that, at the end of the interval $T_{IN}$, a charge q remains across the photojunction 199/299/399. The operating cycle completes with a read-out phase (i.e., a third phase) during which the value of q is made available to an external circuit. The external circuit reads a voltage remaining across the photojunction 199/299/399 (voltage of the diode terminal DD with respect to voltage of the gate terminal G), and then derives the difference between Q and q. This difference between Q and q represents the photo-response of the device for the operating interval $T_{IN}$.

Alternate methods of biasing the gate terminal G while operating the device in the photo-integrating operating mode can be used with varying advantages. For example, when the threshold of the photo-capacitor is depletion type, the gate terminal G and the diode terminal DD can be tied together during the entire operating cycle. This method advantageously eliminates the overhead of an extra bias supply as well as an extra switch (i.e., the switch needed to float the gate terminal G during the second and third phases of the operating cycle).

In another alternate method, the gate terminal G is tied to the bias source permanently. The value of the bias potential $V_G$ (applied to the gate terminal G) required for this method is at least the value of the bias voltage applied to the diode terminal DD during the reset phase, plus one $V_{TH}$ as discussed above in the case of the continuous operating mode. This method eliminates the need for an extra switch, but does not eliminate the need for an extra bias supply (except when the photo-capacitor is depletion type, in which case there is no need for an extra supply to begin with). This alternate method is effective when the photo-capacitor area is small as compared to the photodiode area.

In yet another alternate operating method, the gate terminal G can be connected to bias potential $V_G$ during the integration phase, and to a potential having a value less than $V_{TH}$ during the reset and the read-out phases. When the photo-capacitor is an enhancement-type device, the value during the reset and read-out phases can be a zero value (e.g., circuit ground potential). Bias potential $V_G$ is a voltage equal to at least the voltage applied at the diode terminal DD plus one $V_{TH}$. As compared with the other described methods, this last method dissipates more power, requires one additional switch, and requires one or two additional bias sources depending on the photo-capacitor type (i.e., enhancement or depletion). However, this latter method potentially produces a higher read-out voltage during the read-out phase for the residual charge q, which can be very important for certain applications. The value of the output voltage for a given q in this case is a function of the ratio of the photodiode area to the photo-capacitor area.

Figure 4:
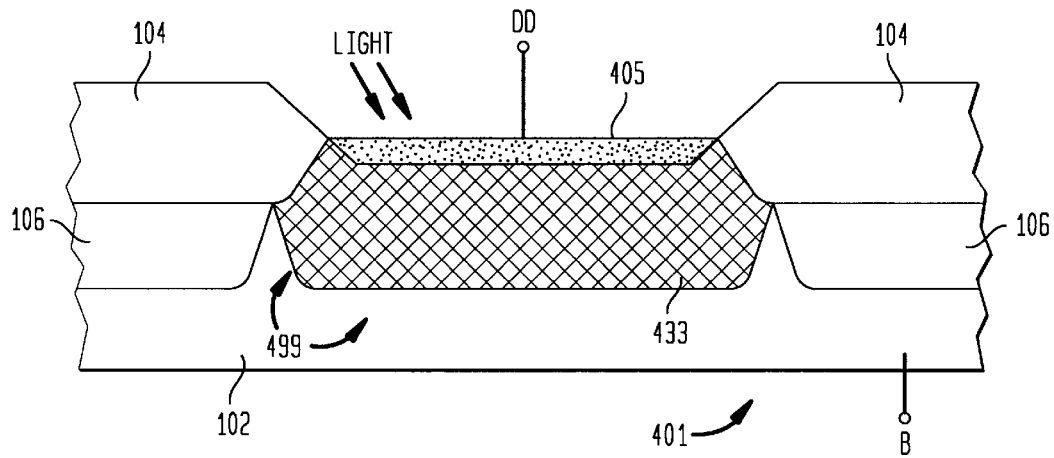
FIG. 4 is a cross section of a photosensing device with a deep diffusion layer underlying an entire shallow diffusion layer to overcome excessive leakage problems of a shallow junction periphery.
Figure 5:
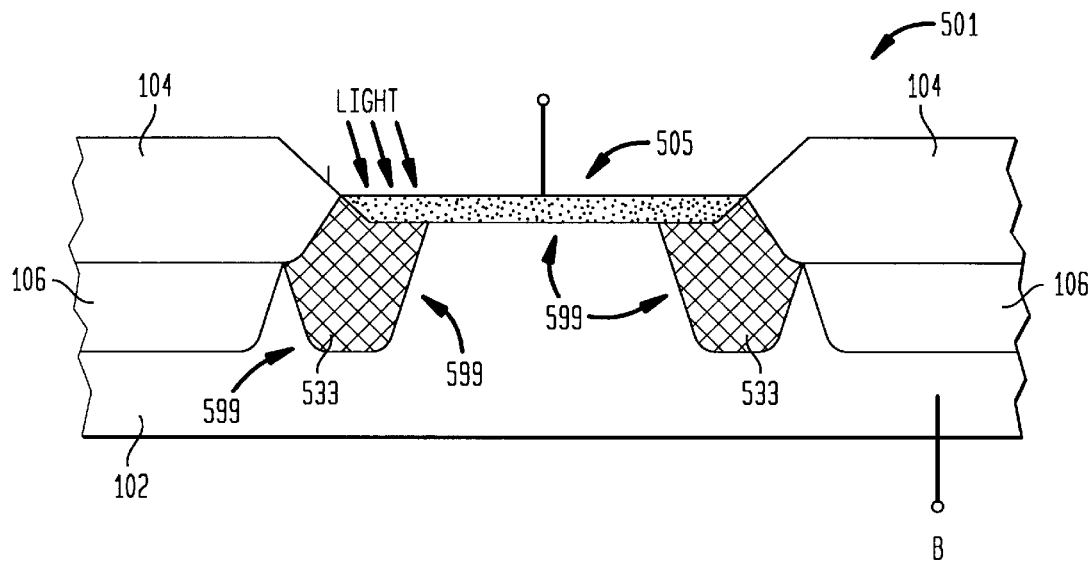
FIG. 5 is a cross section of a photosensing device with a deep diffusion layer as a ring structure underlying only the periphery of the shallow diffusion layer to overcome excessive leakage problems of a shallow junction periphery.

Other exemplary embodiments of the present invention are shown as photosensing devices 401 and 501 in FIGS. 4 and 5 respectively. Both of these photosensing devices 401 (FIG. 4) and 501 (FIG. 5) overcome the excessive leakage problems of a shallow junction periphery by terminating a shallow n⁺ S/D diffusion layer feature 405 (FIG. 4) and 505 (FIG. 5), respectively, inside a deep, low concentration diffusion. As shown in FIG. 4, the deep, low concentration diffusion is a deep n-tub diffusion layer 433 underlying the entire shallow n⁺ S/D diffusion layer feature 405. In FIG. 5, the deep, low concentration diffusion is a deep n-tub diffusion ring layer 533 underlying only the periphery of the shallow n⁺ S/D diffusion layer feature 505. In a standard CMOS fabrication process, these structures are constructed by underlying the shallow n⁺ S/D diffusion layer features 405/505 with the n-tub diffusion layer 433 and n-tub diffusion ring layer 533, respectively. As shown in FIGS. 4 and 5, the body terminal B is connected to the substrate 102, while the diode terminal DD is connected to the n⁺ S/D diffusion layer features 405/505.

The photosensing device 401 of FIG. 4 provides photojunction 499 at the interface between the n-tub diffusion layer 433 and the substrate 102 (i.e., p-substrate shown). The photosensing device 501 of FIG. 5 provides photojunction 599 at the interfaces between the n-tub diffusion ring layer 533, shallow n⁺ S/D diffusion layer feature 505, and the substrate 102. As would be understood, the photosensing device 401 (FIG. 4), because of its depth, has an adequate spectral response only at the red end of the spectrum, whereas the photosensing device 501 (FIG. 5) could be optimized to respond across the entire spectrum. In both cases, a ratio of the area of the deep diffusion feature (the n-tub diffusion layer 433 (FIG. 4) and n-tub diffusion ring layer 533 (FIG. 5)) to the total area of the photosensing device 401/501 can be scaled to control the relative sensitivity at the red end of the light spectrum.

Figure 6:
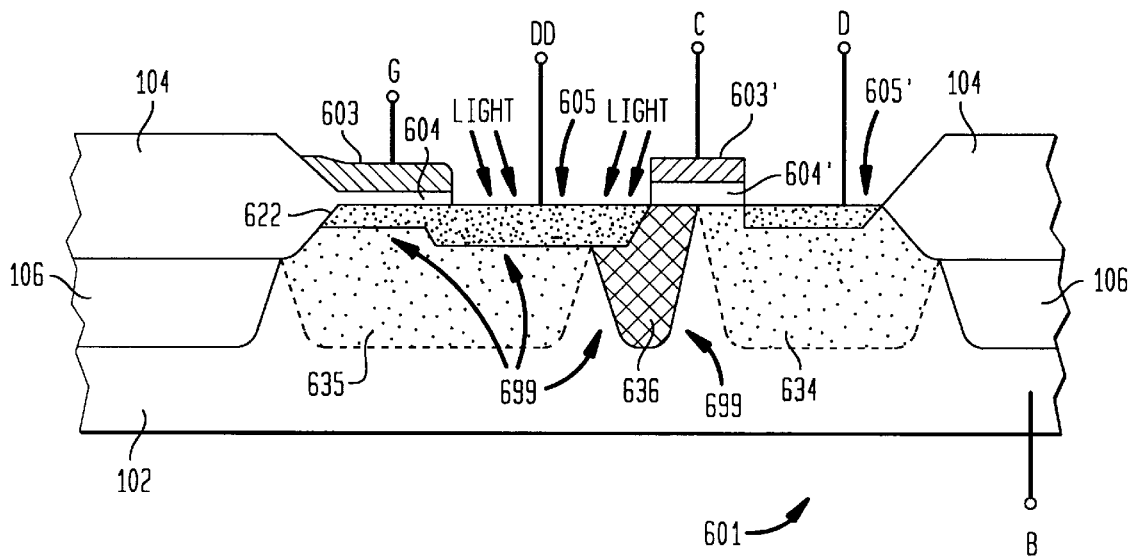
FIG. 6 is cross section of a photosensing device merged with a switch transistor in accordance with the present invention.

Referring now to FIG. 6, there is shown a merging of previous embodiments of the photosensing device of the present invention with an MOS Field Effect Transistor (MOSFET) into a merged structure 601. More specifically, the junction diode, the MOS capacitor, and the MOSFET are integrated on the semiconductor substrate. As will be described in more detail, the junction diode is surrounded completely by a structure formed partially by the MOS capacitor and partially by a source feature of the MOSFET structure. The junction region of the junction diode adjoins physically and electrically the body-junction region of the MOS capacitor and a body-junction region of the MOSFET. As such, the junction region of the junction diode, the body-junction region of the MOS capacitor, and at least part of the body-junction region of the MOSFET together define the photojunction region which operates as the sensing region for the photosensing device. The merged structure 601 enhances layout efficiency and advantageously reduces photosensing device leakage.

In more detail, the photosensing portion of the merged structure 601 can be seen (in cross-section plane) as a merging of a left portion of the photosensing device 101 (FIG. 1) with a right portion of the photosensing device 501 (FIG. 5). As in the case of photosensing devices 101 (FIG. 1) and 501 (FIG. 5), an edge of the n+ S/D diffusion layer feature 605 (FIG. 6) is deactivated electrically by means of a surrounding structure which forces a photojunction 699 to terminate at some safe distance away from an edge of the n+ S/D diffusion layer feature 605. This surrounding structure is partly an MOS capacitor structure (i.e., exactly as the MOS capacitor structure of photosensing device 101) and partly a deep n-tub ring feature 636 which serves the exact purpose of the deep n-tub diffusion ring layer 533 of photosensing device 501 from FIG. 5. The source feature of the MOSFET is merged on a portion of the deep n-tub ring feature 636 of the surrounding structure. Specifically, the source feature of the MOSFET is defined by the portion of n+ S/D diffusion layer feature 605 which overlays a portion of the deep n-tub ring feature 636.

The MOSFET further includes a gate feature that includes a thin (gate) oxide layer feature 604' disposed over the substrate 102 in such a way that one edge of thin (gate) oxide layer feature 604' self-aligns with an edge of n+ S/D diffusion layer feature 605. The gate feature further includes a polysilicon gate thin film (conductive) layer 603' which overlays the thin oxide feature layer 604' and also self-aligns with n+ S/D diffusion layer feature 605. A drain feature of the MOSFET is defined by the portion of the n+ S/D diffusion layer feature 605' which overlays a portion of a p-tub feature 634. The n+ S/D diffusion layer feature 605 and n+ S/D diffusion layer feature 605' abut and self-align with two separate segments of a periphery of the gate feature and operate as electrically separate semiconductor regions.

The p-tub feature 634, which normally in CMOS technology underlies an n-channel transistor entirely, underlies only a portion of the MOSFET of the merged structure 601 by extending under the n+ S/D diffusion layer feature 605' entirely and under the thin oxide layer feature 604' partially as shown. More specifically, FIG. 6 shows the thin oxide layer feature 604' of the MOSFET underlied by the p-tub feature 634 on the MOSFET's drain side and by the n-tub ring feature 636 on the MOSFET's source side. The n-tub ring feature 636 is a physical extension of the n+ S/D diffusion layer feature 605, and thus, n-tub ring feature 636 is part of the MOSFET's electrical source feature. The p-tub feature 634 functions electrically as a body feature of the MOSFET, such that the electrical length of the MOSFET is the length of the p-tub feature 634 underlying the thin oxide feature 604'.

As shown in FIG. 6, the gate terminal G is used in the same manner as previously described for FIG. 1. However, the diode terminal DD (from FIG. 1) is not used in merged structure 601 to apply a voltage to the photodiode as was the case for photosensing device 101. Instead, in a normal operating context, electrical contact to n+ S/D diffusion layer feature 605 of the merged structure 601 is made through the body terminal B rather than the diode terminal DD. The diode terminal DD in this case is a signal sense terminal. Additionally, a control terminal C is used in merged structure 601 to apply a transistor gate voltage to the polysilicon gate thin film (conductive) layer 603' to control the type and time of access. More specifically, the control terminal C is biased accordingly to cause the MOSFET to alternately switch on and off. A drain terminal D is used in merged structure 601 to apply a voltage to the MOSFET's drain feature (i.e., n+ S/D diffusion layer feature 605').

The photojunction 699 occurs at the interface between n-type and p-type semiconductor regions. Since the n-tub ring feature 636 forces the photojunction 699 away from a surface of the merged structure 601, the extent to which the n-tub ring feature 636 underlies the n+ S/D diffusion layer feature 605, therefore, controls the relative response of the merged structure 601 to the red end of the spectrum as discussed for photosensing device 501 (FIG. 5). For example, by scaling the ratio of the area of the source feature of the MOSFET to the total area of the merged structure 601, the relative sensitivity at the red end of the light spectrum can be controlled. Also, by adjusting the area of the photo-capacitor structure relative to the area of n+ S/D diffusion layer feature 605' underlied by the p-tub feature 634, the relative response of the merged structure 601 device can be adjusted to the blue end of the spectrum as discussed for photosensing device 101 (FIG. 1). For example, by scaling the ratio of the area of the junction diode to the area of the MOS capacitor, the relative sensitivity at the blue end of the light spectrum can be controlled.

Figure 7:
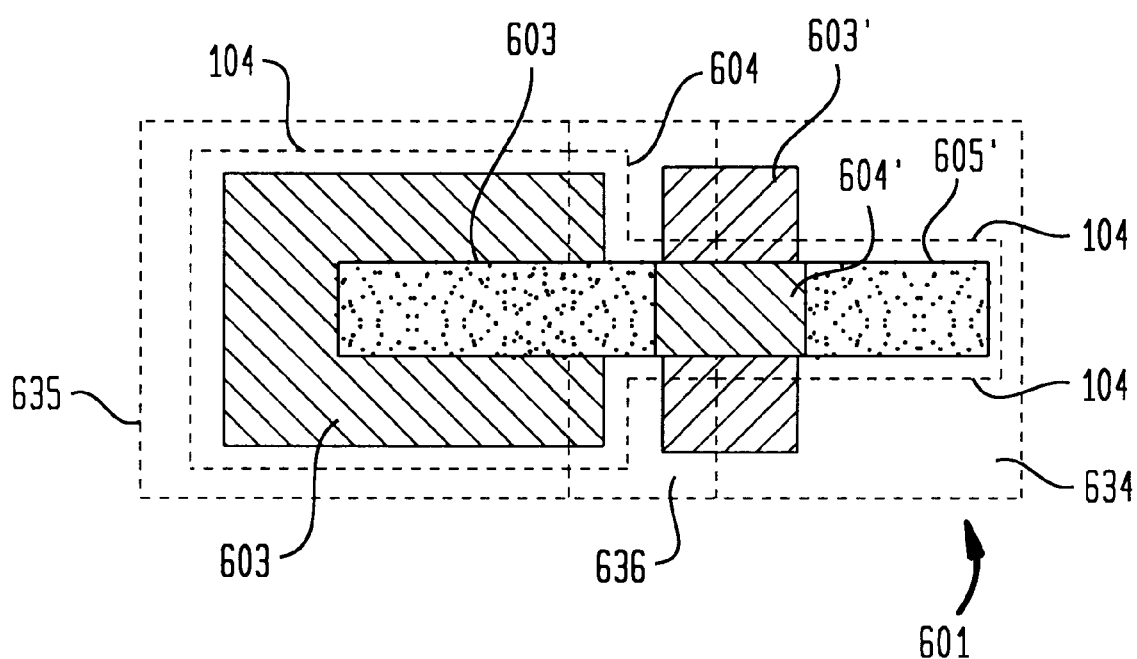
FIG. 7 is a top view of the photosensing device of FIG. 6.

FIG. 7 shows a top view of the merged structure 601 from FIG. 6. Referring to FIG. 6 and 7 in combination with one another, it can be seen that the periphery of the photodiode structure is partly merged with the photo-capacitor structure, and partly with a deep n-tub type diffusion.

It is noted that the photosensing device of the present invention comprises layered features of doped crystal semiconductor, insulating oxide, polysilicon thin film, and metal thin film. Accordingly, the properties and the manufacture of these materials are well known to those skilled in the art of CMOS technology. Additionally, photojunction operating principles and construction, and more particularly the construction and operation of poly-gate MOS capacitors and junction photodiodes are also well known to persons skilled in the art. As such, it can be expected that numerous modifications of this invention will be apparent to those skilled in the art in view of the foregoing description. Accordingly, this description is to be construed as illustrative only and is for the purpose of teaching those skilled in the art the best mode of carrying out the invention. Details of the structure may be varied substantially without departing from the spirit of the invention and the exclusive use of all modifications which come within the scope of the appended claims is hereby reserved.

What is claimed is:

1. A photosensing semiconductor device comprising:
   a semiconductor substrate of a first conductivity type;
   a junction diode having a junction region; and
   a Metal Oxide Semiconductor (MOS) capacitor having a body-junction region when biased into an inversion mode, said MOS capacitor and said junction diode being integrated on said semiconductor substrate, said MOS capacitor surrounding said junction diode with said body-junction region of said MOS capacitor physically and electrically adjoining said junction region of said junction diode,
   said junction region of said junction diode and said body-junction region of said MOS capacitor jointly defining a photojunction region, said photojunction region being operable as a sensing region for the photosensing semiconductor device.

2. The photosensing semiconductor device according to claim 1, wherein said junction diode includes:

a first electrical side comprising a region of said semiconductor substrate, said region being of said first conductivity type; and a second electrical side comprising a shallow diffused feature of a second conductivity type disposed on a surface of said region of said semiconductor substrate, wherein said second conductivity type is opposite to said first conductivity type.

3. The photosensing semiconductor device according to claim 2 wherein said junction diode and said MOS capacitor are disposed entirely over said region, wherein said region includes a deep diffused feature of said first conductivity type, wherein conductivity of said semiconductor substrate is defined by said deep diffused feature.

4. The photosensing semiconductor device according to claim 2 wherein said semiconductor substrate further includes a deep diffused feature of said second conductivity type, said shallow diffused feature of said junction diode being partially disposed over said deep diffused feature.

5. The photosensing semiconductor device according to claim 2 wherein said semiconductor substrate further includes a deep diffused feature of said second conductivity type, said junction diode and said MOS capacitor being partially disposed over said deep diffused feature.

6. The photosensing semiconductor device according to claim 1, wherein said MOS capacitor includes:

a first electrical side comprising a region of said semiconductor substrate, said region being of said first conductivity type;

a spacer dielectric layer comprising a thin oxide layer disposed directly over said region of semiconductor substrate; and a second electrical side comprising a conductive thin film disposed directly over said dielectric layer, wherein said dielectric layer and said second electrical side are operably transparent to a target portion of a light spectrum.

7. The photosensing semiconductor device according to claim 6, wherein said region comprises a deep diffused feature of said first conductivity type, and wherein said deep diffused feature at least partially underlies said dielectric layer.

8. The photosensing semiconductor device according to claim 1, further comprising:

a body terminal connected to said semiconductor substrate;

a gate terminal connected to a field plate of said MOS capacitor; and a diode terminal connected to a diffused side of said junction diode, wherein said junction diode is operable to be reverse biased in response to an applied bias between said diode terminal and said body terminal, and wherein said MOS capacitor is operable to be biased into inversion in response to an applied bias between said gate terminal and said body terminal.

9. The photosensing semiconductor device according to claim 1, wherein a ratio of an area of said junction diode to a total area of the photosensing semiconductor device is scaleable to control relative sensitivity at a blue end of a light spectrum.

10. The photosensing semiconductor device according to claim 4, wherein a ratio of an area of said junction diode to a total area of the photosensing semiconductor device is scaleable to control relative sensitivity at a red end of a light spectrum.

11. The photosensing semiconductor device according to claim 5, wherein a ratio of an area of said deep diffused feature to a total area of the photosensing semiconductor device is scaleable to control relative sensitivity at a red end of a light spectrum.

12. The photosensing semiconductor device according to claim 1, further comprising:

a body terminal connected to said semiconductor substrate; and a diode terminal connected to a field plate of said MOS capacitor and to a diffused side of said junction diode, said diffused side being of a second conductivity type, wherein said MOS capacitor is depletion-type, and wherein said junction diode is operable to be reverse biased in response to an applied bias between said diode terminal and said body terminal.

13. A photosensing semiconductor device comprising:

a semiconductor substrate of a first conductivity type, said semiconductor substrate including a deep diffusion feature of a second conductivity type, said second conductivity type being opposite to said first conductivity type;

a junction diode including a first electrical side comprising a region of said semiconductor substrate, and a second electrical side comprising a shallow diffusion feature of said second conductivity type disposed on a surface of said region of said semiconductor substrate;

said deep diffusion feature underlying and directly in contact with at least a periphery of said shallow diffusion feature;

and a Metal Oxide Semiconductor (MOS) capacitor having a body-junction region when biased into an inversion mode, said MOS capacitor and said junction diode being integrated on said semiconductor substrate, said MOS capacitor surrounding said junction diode with said body-junction region of said MOS capacitor physically and electrically adjoining said junction region of said junction diode.

14. The photosensing semiconductor device of claim 13, wherein said deep diffusion feature, said substrate and said body-junction region of said MOS capacitor define a photojunction region, said photojunction region being operable as a sensing region for the photosensing semiconductor device.

15. The photosensing semiconductor device of claim 13, wherein said deep diffusion feature, said substrate, said shallow diffusion feature and said body-junction region of said MOS capacitor together define a photojunction region, said photojunction region being operable as a sensing region for the photosensing semiconductor device.

16. The photosensing semiconductor device according to claim 13, wherein a ratio of an area of said deep diffusion feature to a total area of the photosensing semiconductor device is scaleable to control relative sensitivity at a red end of a light spectrum.

17. A switch-accessed, photosensing semiconductor device comprising:

a junction diode having a junction region;

a Metal Oxide Semiconductor (MOS) capacitor having a body-junction region when biased into an inversion mode; and a Metal Oxide Semiconductor Field Effect Transistor (MOSFET) having a body-junction region and a source feature;

said junction diode, said MOS capacitor, and said MOS-FET being integrated on a semiconductor substrate of a first conductivity type, wherein said junction diode is surrounded completely by a structure formed partially by said MOS capacitor and partially by said source feature of said MOSFET, wherein said junction region of said junction diode physically and electrically adjoins said body-junction region of said MOS capacitor and said body-junction region of said MOSFET, and wherein said junction region of said junction diode, said body-junction region of said MOS capacitor, and at least a part of said body-junction region of said MOSFET together define a photojunction region, said photojunction region being operable as a sensing region for the photosensing semiconductor device.

18. The photosensing device according to claim 17, wherein said MOSFET device further includes:
   a gate feature comprising a thin oxide layer disposed over said substrate and a conductive thin film layer disposed over said thin oxide layer; and
   a drain feature comprising a shallow feature including a heavily doped surface region of said substrate, said shallow feature being of a second conductivity type,
   wherein said source feature includes a shallow feature comprising a second heavily doped surface region of said substrate, said shallow feature of said source feature being of said second conductivity type, and
   wherein said shallow feature of said source feature and said shallow feature of said drain feature are operable as electrically separate semiconductor regions, said shallow feature of said source feature and said shallow feature of said drain feature abutting two separate segments of a periphery of said gate feature.

19. The photosensing device according to claim 18 further comprising:
   a first tub feature comprising a diffused lightly doped region of said substrate, said first tub feature being of said first conductivity type; and
   a second tub feature comprising a second diffused lightly doped region of said substrate, said second tub feature being of said second conductivity type,
   said first tub feature underlying said drain feature and a portion of said gate feature adjacent to said drain feature, and
   said second tub feature underlying said source feature and a portion of said gate feature adjacent to said source feature.

20. The photosensing semiconductor device according to claim 19, wherein a ratio of an area of said source feature of said MOSFET to a total area of the photosensing semiconductor device is scaleable to control relative sensitivity at a red end of a light spectrum.

21. The photosensing semiconductor device according to claim 17, wherein said junction diode includes:
   a first electrical side comprising a region of said semiconductor substrate, said region being of said first conductivity type; and
   a second electrical side comprising a shallow diffused feature of a second conductivity type disposed on a surface of said region of said semiconductor substrate.

22. The photosensing semiconductor device according to claim 17, wherein said MOS capacitor includes:
   a first electrical side comprising a region of said semiconductor substrate, said region being of said first conductivity type;
   a spacer dielectric layer comprised of a thin oxide layer disposed directly over said region of semiconductor substrate; and
   a second electrical side comprised of a conductive thin film disposed directly over said dielectric layer,
   wherein said dielectric layer and said second electrical side are operably transparent to a target portion of a light spectrum.

23. The photosensing semiconductor device according to claim 17, further including a tub feature, said tub feature comprising a diffused lightly doped region of said substrate and being of said first conductivity type, said tub feature underlying said junction diode and said MOS capacitor.

24. The photosensing semiconductor device according to claim 17 further comprising:
   a body terminal connected to said semiconductor substrate;
   a gate terminal connected to a field plate of said MOS capacitor;
   a diode terminal connected to a shallow diffused feature of said junction diode;
   a drain terminal connected to a drain feature of said MOSFET; and
   a control terminal connected to a gate feature of said MOSFET, said control terminal being operable to be biased to cause said MOSFET to alternately switch on and off,
   wherein said junction diode is operable to be reverse biased in response to an applied bias between said drain terminal and said body terminal, and wherein said MOS capacitor is operable to be biased into inversion in response to an applied bias between said gate terminal and said body terminal.

25. The photosensing semiconductor device according to claim 17, further comprising:
   a body terminal connected to said semiconductor substrate;
   a source terminal connected to said source feature of said MOSFET; and
   a control terminal connected to a gate feature of said MOSFET, said control terminal being operable to be biased to cause said MOSFET to alternately switch on and off,
   wherein said junction diode is operable to be reverse biased in response to an applied bias between said source terminal and said body terminal, and wherein a gate of said MOS capacitor is connected to a diffused side of said junction diode, said diffused side being of a second conductivity type, and
   wherein said MOS capacitor is depletion-type.

26. The photosensing semiconductor device according to claim 17, wherein a ratio of an area of said junction diode to an area of said MOS capacitor is scaleable to control relative sensitivity at a blue end of a light spectrum.

27. The photosensing semiconductor device according to claim 1, wherein:
   said junction diode and said MOS capacitor are integrated on said semiconductor substrate together with other semiconductor devices, said other semiconductor devices being interconnected to integrated circuits;
   wherein the photosensing semiconductor device is electrically isolated from said other semiconductor devices by an oxide ring disposed over said semiconductor substrate; and wherein said oxide ring is disposed above diffused regions of said semiconductor substrate.

28. The photosensing semiconductor device according to claim 13, wherein:

said junction diode and said MOS capacitor are integrated on said semiconductor substrate together with other semiconductor devices, said other semiconductor devices being interconnected to integrated circuits;

wherein the photosensing semiconductor device is electrically isolated from said other semiconductor devices by an oxide ring disposed over said semiconductor substrate; and wherein said oxide ring is disposed above diffused regions of said semiconductor substrate.

29. The photosensing semiconductor device according to claim 17, wherein:

said junction diode and said MOS capacitor are integrated on said semiconductor substrate together with other semiconductor devices, said other semiconductor devices being interconnected to integrated circuits;

wherein the photosensing semiconductor device is electrically isolated from said other semiconductor devices by an oxide ring disposed over said semiconductor substrate; and wherein said oxide ring is disposed above diffused regions of said semiconductor substrate.

\* \* \* \* \*